(12) United States Patent
Andry et al.

(10) Patent No.: US 9,159,602 B2
(45) Date of Patent: Oct. 13, 2015

(54) APPARATUS AND METHODS FOR CONSTRUCTING SEMICONDUCTOR CHIP PACKAGES WITH SILICON SPACE TRANSFORMER CARRIERS

(75) Inventors: Paul S. Andry, Yorktown Heights, NY (US); John M. Cotte, New Fairfield, CT (US); John U. Knickerbocker, Monroe, NY (US); Cornelia K. Tsang, Mohegan Lake, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1314 days.

(21) Appl. No.: 12/543,827

(22) Filed: Aug. 19, 2009

(65) Prior Publication Data
US 2010/0013073 A1 Jan. 21, 2010

Related U.S. Application Data

(62) Division of application No. 11/748,818, filed on May 15, 2007.

(51) Int. Cl.
| | |
|---|---|
| *H01L 23/02* | (2006.01) |
| *H01L 21/683* | (2006.01) |
| *H01L 23/14* | (2006.01) |
| *H01L 23/498* | (2006.01) |
| *H01L 23/50* | (2006.01) |
| *H01L 23/00* | (2006.01) |
| *H01L 25/065* | (2006.01) |

(52) U.S. Cl.
CPC .......... *H01L 21/6835* (2013.01); *H01L 23/147* (2013.01); *H01L 23/49827* (2013.01); *H01L 23/49833* (2013.01); *H01L 23/50* (2013.01); *H01L 24/81* (2013.01); *H01L 25/0655* (2013.01); *H01L 25/0657* (2013.01); *H01L 2221/68345* (2013.01); *H01L 2224/16225* (2013.01); *H01L 2224/81801* (2013.01); *H01L 2924/01019* (2013.01); *H01L 2924/01077* (2013.01); *H01L 2924/01079* (2013.01); *H01L 2924/10253* (2013.01); *H01L 2924/15174* (2013.01); *H01L 2924/15311* (2013.01); *H01L 2924/19041* (2013.01); *H01L 2924/3025* (2013.01)

(58) Field of Classification Search
USPC ......................................................... 257/686
See application file for complete search history.

(56) References Cited

U.S. PATENT DOCUMENTS

| | | |
|---|---|---|
| 3,787,252 A | 1/1974 | Filippazzi et al. |
| 4,939,568 A | 7/1990 | Kato et al. |
| 5,024,966 A | 6/1991 | Dietrich et al. |
| 5,039,628 A | 8/1991 | Carey |
| 5,198,888 A | 3/1993 | Sugano |
| 5,391,917 A | 2/1995 | Gilmour |

(Continued)

OTHER PUBLICATIONS

Office Action dated Oct. 6, 2010 for U.S. Appl. No. 11/748,818.

(Continued)

*Primary Examiner* — Marvin Payen
(74) *Attorney, Agent, or Firm* — F. Chau & Associates, LLC

(57) ABSTRACT

Apparatus and methods are provided for high density packaging of semiconductor chips using silicon space transformer chip level package structures, which allow high density chip interconnection and/or integration of multiple chips or chip stacks high I/O interconnection and heterogeneous chip or function integration.

13 Claims, 14 Drawing Sheets

(56) References Cited

U.S. PATENT DOCUMENTS

| | | | |
|---|---|---|---|
| 5,506,755 A | 4/1996 | Miyagi |
| 5,608,262 A | 3/1997 | Degani et al. |
| 5,618,752 A | 4/1997 | Gaul |
| 5,646,067 A | 7/1997 | Gaul |
| 5,646,828 A | 7/1997 | Degani et al. |
| 5,654,590 A | 8/1997 | Kuramochi |
| 5,656,856 A | 8/1997 | Kweon |
| 5,717,245 A | 2/1998 | Pedder |
| 5,763,947 A | 6/1998 | Bartley |
| 5,854,534 A | 12/1998 | Beilin et al. |
| 5,869,894 A | 2/1999 | Degani et al. |
| 5,910,685 A | 6/1999 | Watanabe et al. |
| 5,942,795 A | 8/1999 | Hoang |
| 5,953,213 A | 9/1999 | Napierala |
| 5,990,550 A | 11/1999 | Umezawa |
| 5,998,292 A | 12/1999 | Black et al. |
| 6,002,178 A | 12/1999 | Lin |
| 6,006,428 A | 12/1999 | Feilchenfeld et al. |
| 6,013,948 A | 1/2000 | Akram et al. |
| 6,034,427 A | 3/2000 | Lan et al. |
| 6,046,499 A | 4/2000 | Yano et al. |
| 6,049,465 A | 4/2000 | Blish, II et al. |
| 6,052,287 A | 4/2000 | Palmer et al. |
| 6,064,113 A | 5/2000 | Kirkman |
| 6,081,026 A | 6/2000 | Wang et al. |
| 6,221,769 B1 | 4/2001 | Dhong et al. |
| 6,268,660 B1 | 7/2001 | Dhong et al. |
| 6,661,088 B1 * | 12/2003 | Yoda et al. ............ 257/700 |
| 6,791,133 B2 | 9/2004 | Farooq et al. |
| 2003/0132529 A1 | 7/2003 | Yeo et al. |
| 2004/0108587 A1 | 6/2004 | Chudzik et al. |
| 2005/0046002 A1 | 3/2005 | Lee et al. |
| 2005/0105860 A1 | 5/2005 | Oono et al. |
| 2005/0121768 A1 | 6/2005 | Edelstein et al. |
| 2006/0027934 A1 | 2/2006 | Edelstein et al. |
| 2006/0057836 A1 | 3/2006 | Nagarajan et al. |
| 2006/0202322 A1 | 9/2006 | Kariya et al. |
| 2006/0263937 A1 | 11/2006 | Fukase et al. |
| 2006/0278989 A1 * | 12/2006 | Trezza ............ 257/773 |
| 2006/0284304 A1 | 12/2006 | Caletka et al. |
| 2007/0048896 A1 | 3/2007 | Andry et al. |
| 2008/0179083 A1 | 7/2008 | Del Rosario et al. |

OTHER PUBLICATIONS

Office Action dated Dec. 10, 2010 for U.S. Appl. No. 12/538,223.

* cited by examiner

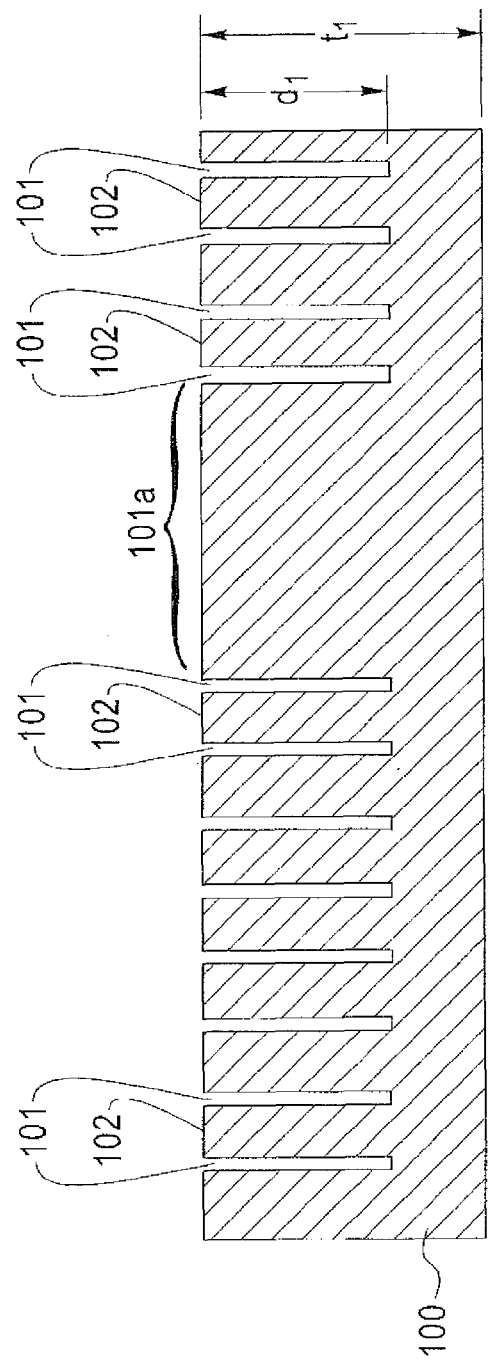
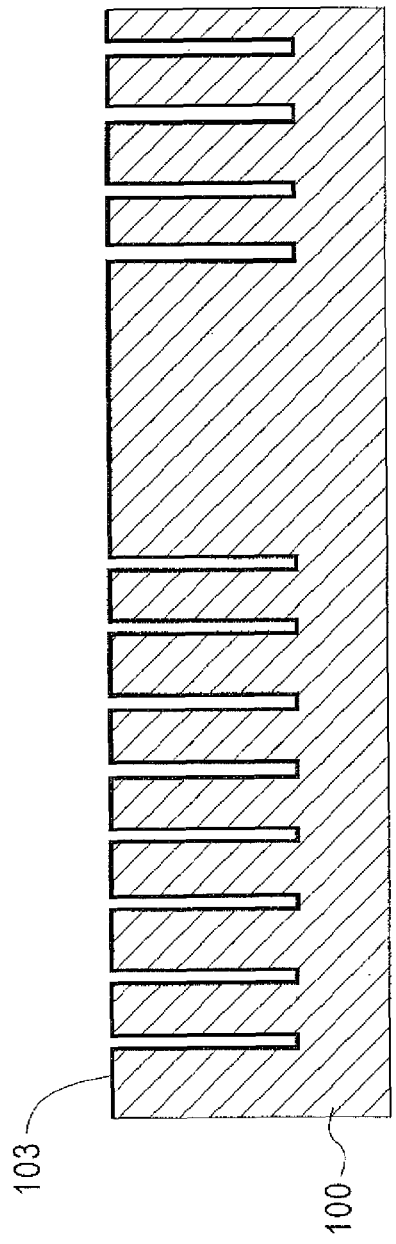
FIG. 6A
FIG. 6B

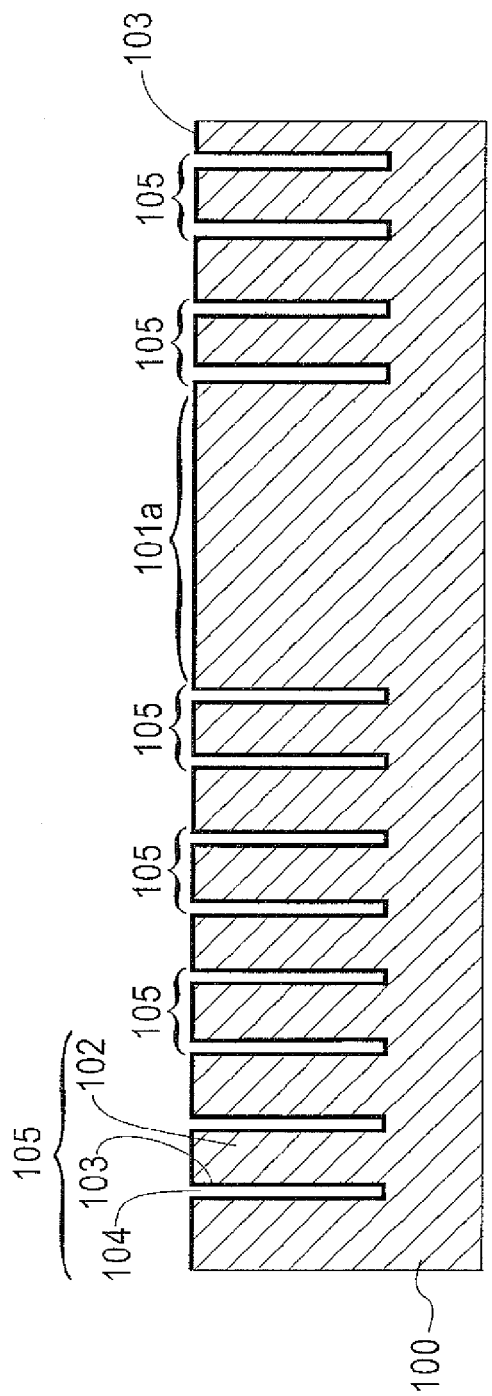
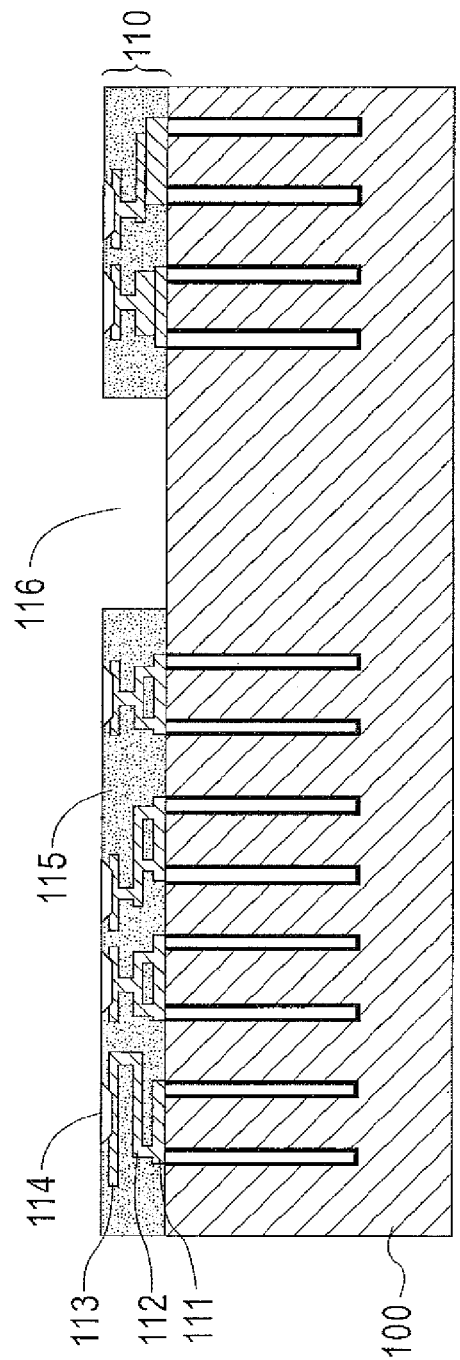

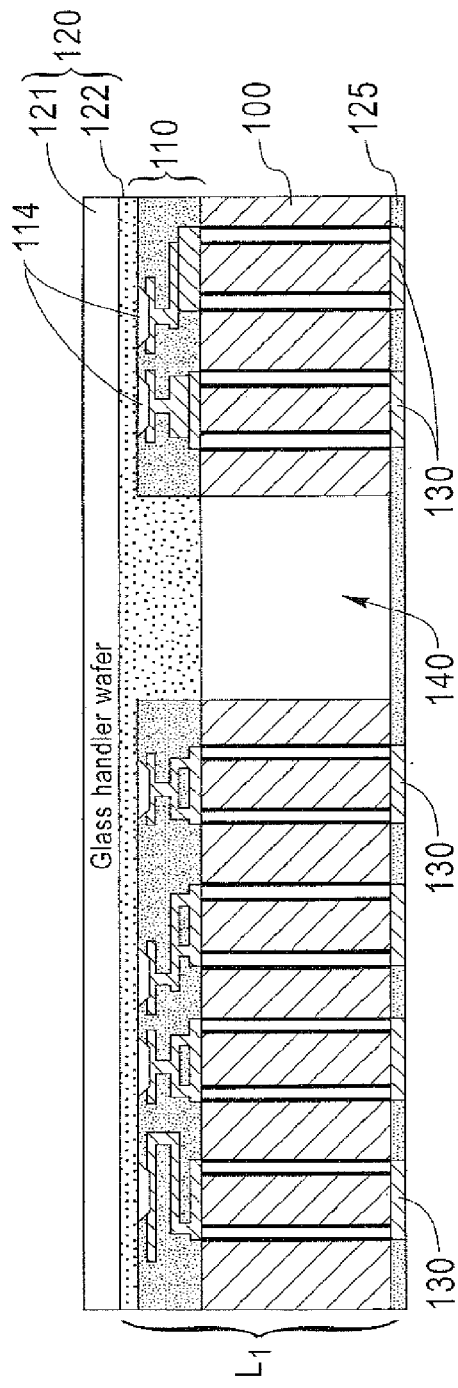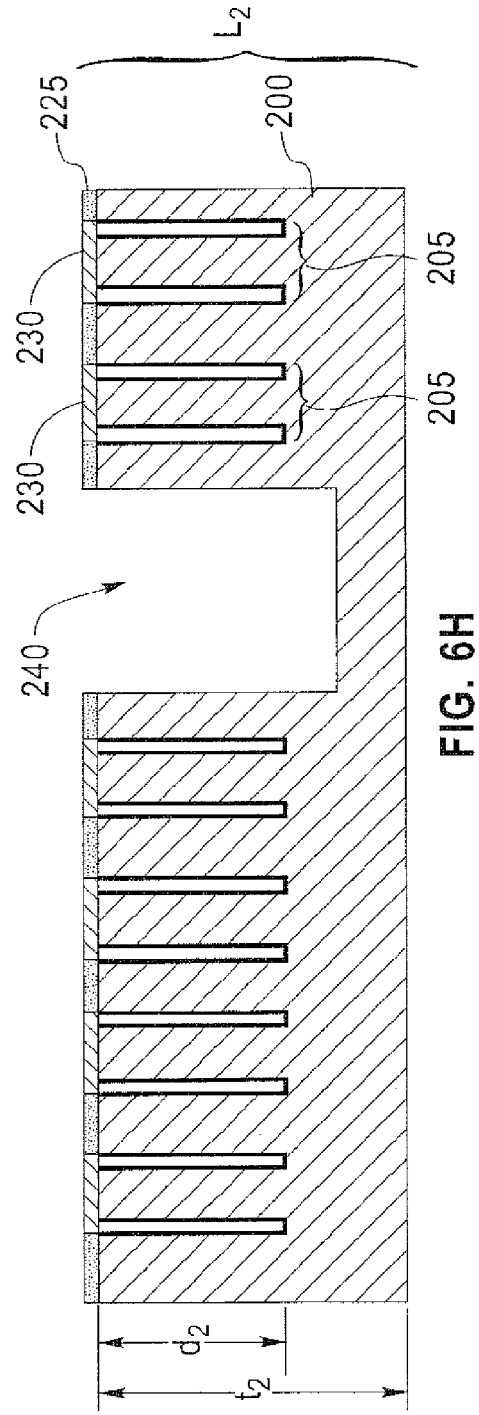
FIG. 6G
FIG. 6H

# APPARATUS AND METHODS FOR CONSTRUCTING SEMICONDUCTOR CHIP PACKAGES WITH SILICON SPACE TRANSFORMER CARRIERS

CROSS-REFERENCE TO RELATED APPLICATION

This is a divisional application of co-pending U.S. application Ser. No. 11/748,818, filed May 15, 2007, which is hereby incorporated by reference for all purposes as if fully set forth herein.

GOVERNMENT LICENSE RIGHTS

This invention was made with Government support under Contract No. H98230-04-C-0920, NBCH3039004 awarded by the DARPA (Defense Advanced Projects Agency) The Government has certain rights in this invention.

TECHNICAL FIELD OF THE INVENTION

The present invention relates generally to microelectronic packaging of semiconductor chips and, more specifically, apparatus and methods for high density packaging of semiconductor chips using silicon space transformer chip level package structures.

BACKGROUND

Advances in semiconductor chip fabrication and packaging technologies have enabled the development of highly integrated semiconductor chips and compact chip package structures or electronic modules. For example, silicon integrated circuit chips can be fabricated with high integration density and functionality to form what is referred to as SoC (System on Chip). With SoC designs, the functionality of a complete system (e.g., computer) is integrated on a single silicon die. SoC solutions may not be practical or achievable for chip-level integration when given systems design requires the use of heterogeneous semiconductor technologies to fabricate the necessary system integrated circuits.

In addition, when fabricating thinned IC devices, packages, IC stacks or package stacks, the thinned components may be fragile to handle and lead to yield losses if broken or damaged and may become non planar due to stresses such as circuits, wiring or vias causing the thinned component to bend or bow. In some cases, the bow or bending can be excessive and make handling or assembly difficult or impossible without added costs of mechanical handlers, temporary adhesives or figures and release processes.

In this regard, SIP (System In a Package) or SOP (System On a Package) techniques are used to integrate various die technologies (e.g., Si, GaAs, SiGe, SOT) to form a complete system which approximates SoC performance. By way of example, a SOP module can be constructed by mounting a plurality of semiconductor chips to a chip carrier substrate to form a first level (or chip level) package structure. In conventional packaging technologies, chip level carrier substrates are constructed using organic laminate build up or ceramic carrier substrate technologies. Typically, first level package having conductive through-vias (and other conductive wiring) which provide I/O and power interconnects between IC chips on the top-side of the carrier and I/O contacts on a next level packaging structure coupled to the bottom-side of the chip carrier.

As the number of circuits on a single chip is increased or as need rises to interconnect chips with much higher density I/O, or for miniaturization or for heterogeneous chip integration, or for integration of chips and stacked chips, the need arises for new packaging which can support higher wiring density and smaller form factors. As the number of circuits on a chip increase, higher density I/O packaging is typically needed or for heterogeneous chip or chip stack integration. However, there are disadvantages associated with organic and ceramic carrier technologies including, for example, high fabrication costs and inherent limitations the practical integration density, I/O density, power density, etc, that may be achieved using organic or ceramic carriers, as is known in the art. It is believed that inherent limitations and high fabrication costs associated with ceramic and organic carrier technologies may limit the ability or desire to use such carrier technologies to meet the increasing demands for higher density and higher performance and low cost packaging solutions.

SUMMARY OF THE INVENTION

Exemplary embodiments of the invention generally include apparatus and methods for high density packaging of semiconductor chips using silicon space transformer chip level package structures, which allow high density chip interconnection and/or integration of multiple chips or chip stacks high I/O interconnection and heterogeneous chip or function integration, and which allow packaging of thinned IC chips using thinned Si package(s) in ways that realize low cost handling and assembly, and reduce the non-planarity of the Si package(s), thinned IC or IC stack and/or module assembly.

In one exemplary embodiment of the invention, a silicon space transformer package structure includes a planar silicon substrate having a thickness of less than about 150 microns between first and second opposing planar surfaces. A plurality of conductive through-vias are formed in the planar silicon substrate to provide vertical electrical connections extending through the silicon substrate between the first and second opposing planar surfaces. A wiring layer is formed on the first planar surface of the silicon substrate, which includes a first pattern of electrical contacts and integrated circuit components and redistribution wiring. A second pattern of electrical contacts are formed on the second surface of the silicon substrate. The redistribution wiring and conductive-through vias provide space transform electrical connections between the first pattern and second pattern of electrical contacts.

In various exemplary embodiments of the invention, the first pattern of electrical contacts may be an area array of contacts having a pitch P1 and the second pattern of electrical contacts may be an area array of contacts having a pitch P2, where P2>P1, or the first pattern of electrical contacts may a perimeter array of contacts having a pitch P1 and the second pattern of electrical contacts is an area array of contacts having a pitch P2, where P2>P1.

In another exemplary embodiment of the invention, the silicon space transformer package may further comprise a plurality of passive devices formed on the first planar surface of the silicone substrate and electrically connected to the wiring layer.

In another embodiment of the invention, the wiring layer of the silicone space transformer package may be a multilayer structure comprising three or more metallization levels. The wiring layer may comprise power and ground wiring levels.

The silicon space transformer package may further comprises an open cavity formed therein between the first and second opposing surfaces, in which separate electrical and optical devices can be disposed for high-density packaging or which provide an optical channel to enable optical communications between optical components disposed on opposing sides of the silicon space transformer structures.

In yet another exemplary embodiment of the invention, an electronic apparatus includes a first level package structure and a second level package structure. The first level package structure includes a silicon space transformer chip carrier structure and an IC (integrated circuit) chip flip chip mounted on a first surface of the silicon space transformer chip carrier structure using an first pattern of electrical contacts with pitch P1. The second level package substrate includes a second pattern of electrical contacts with pitch P2, wherein P2>P1, formed on a mounting surface thereof. The first level package structure is mounted to the mounting surface of the second level package substrate with the silicon space transformer chip carrier structure providing space transforming electrical interconnections between the first pattern of electrical contacts and the second pattern of electrical contacts on the mounting surface of the second level package structure.

In another exemplary embodiment of the invention, a method is provided for fabricating a semiconductor package structure beginning with a silicon substrate having a thickness t1 between first and second opposing planar surfaces. A pattern of conductive vias is formed to a depth d below the first surface of silicon substrate, which is less than the thickness t1 of the silicon substrate. A wiring layer is formed on the first surface of the silicon substrate, wherein the wiring layer comprises a first pattern of electrical contacts and redistribution wiring that provides electrical connections between the first pattern of electrical contacts and the conductive vias. A glass handler substrate is bonded to the wiring layer on the first surface of the silicon substrate. The second surface of the silicon substrate is then recessed to expose bottom portions of the blind conductive vias and reduce the thickness t1 of the silicone substrate to a thickness t1', where t1' is less than about 150 microns to about 1-10 um. An insulating layer is then formed on the recessed second surface of the silicon substrate with the bottom portions of the conductive vias exposed. Electrical contacts are then formed on the exposed bottom portions of the conductive vias to provide a second pattern of electrical contacts. The second pattern of electrical contacts are bonded to a third pattern of electrical contacts on a second package substrate layer and the mechanical glass handler substrate is removed.

The second package substrate layer may be a second silicon substrate having a thickness t2 between first and second opposing planar surfaces and a second pattern of conductive vias formed to a depth d2 below the first surface of second silicon substrate, which is less than the thickness t2 of the second silicon substrate, wherein the third pattern of electrical contacts are electrically connected to exposed end portions of respective conductive vias in the second pattern of conductive vias, wherein prior to removing the glass handler substrate, the method further includes recessing the second surface of the second silicon substrate to expose bottom portions of the second pattern of conductive vias and reduce the thickness t2 of the second silicone substrate to a thickness t2', where t2' is less than about 150 microns to about 1-10 um. forming an insulating layer on the recessed second surface of the second silicon substrate with the bottom portions of the second pattern of conductive vias exposed, and forming electrical contacts on the exposed bottom portions of the conductive vias to provide a further pattern of electrical contacts.

In another exemplary embodiment, prior to bonding the second pattern of electrical contacts to the third pattern of electrical contacts on the second package substrate layer, the method further includes etching an open cavity through the silicon substrate from the recessed second surface to the first surface thereof, etching a closed end cavity in the first surface of the second silicon substrate down to a depth below the depth d2 of the second pattern of conductive vias, aligning the open cavity and closed end cavity when bonding the first and second silicon substrates; and opening the closed end cavity during recessing the second surface of the second silicon substrate.

These and other exemplary embodiments, aspects, features and advantages of the present invention will be described or become apparent from the following detailed description of exemplary embodiments, which is to be read in connection with the accompanying drawings.

BRIEF DESCRIPTION OF THE DRAWINGS

FIGS. 6A~6J schematically illustrate a method for fabricating a silicon space transformer package structure according to an exemplary embodiment of the invention.

DETAILED DESCRIPTION OF EXEMPLARY EMBODIMENTS

Figure 1:
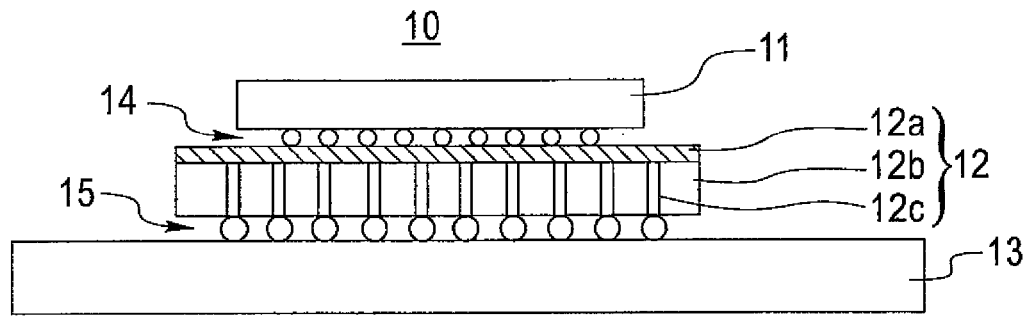
FIG. 1 is a schematic side-view of a semiconductor package that is constructed using a silicon space transformer package structure according to an exemplary embodiment of the invention.

Exemplary embodiments of the invention as discussed herein generally include apparatus and methods for high density packaging of semiconductor chips using silicon space transformer chip level package structures. For instance, FIGS. 1~4 and 5A~5C are high-level schematic illustrations of various chip package structures in which high-density chip level packaging may be realized using one or more thinned silicon space transformer substrate layers. As explained in further detail below, silicon space transformer package structures according to exemplary embodiments of the invention may utilize state of the art silicon manufacturing techniques which follow CMOS back-end-of line design rules to realize low-cost fabrication of silicon space transformer package structures having high density wiring and conductive through-via interconnects which provide space transformation using one or more thinned silicon space transformer substrate layers for high I/O density packaging of one or more IC chips. A silicon space transformer package structure may have conductive through-vias that permit electrical connections to extend (z-direction) through the one or more thin silicon space transformer substrate layers and multilevel wiring structures formed on surfaces of one or more of the thin silicon space transformer substrate layers to provide redistribution of electrical interconnections (x-y direction) between top-side and bottom-side I/O contacts on the one or more silicon space transformer substrate layers. The space transformation may be from an area array pitch to another area array pitch of same or different pitch, or from a perimeter array to an area array of contacts, or from a custom I/O footprint to another custom I/O footprint of I/O contact and such space transformation may be designed to provided fan in distribution wiring, fan out distribution wiring, or a combination thereof. The space transformation wiring may include signal, power and/or ground wiring.

Exemplary structures and methods for constructing semiconductor chip packages using silicon space transformer package structures will now be described more fully with reference to the accompanying drawings. It is to be understood that the thickness and dimensions of the semiconductor package components, structures, layers, regions, etc., as depicted in the figures are not drawn to scale, but are merely depicted for ease of illustration and exaggerated for clarity. It is to be further understood that when a layer is described as being "on" or "over" another layer or substrate, such layer may be directly on the other layer or substrate, or intervening layers may also be present. Moreover, elements that are similar or the same will be denoted by the same reference numeral throughout the drawings.

FIG. 1 is a schematic side-view of a semiconductor package (10) that is constructed using a silicon space transformer package structure according to an exemplary embodiment of the invention. The semiconductor package (10) generally comprises a stacked structure comprising an integrated circuit (IC) chip (11), a silicon space transformer substrate (12) and a package substrate (13). The thinned IC chip (11) is flip-chip mounted to the silicon space transformer substrate (12) using a high density pattern of solder bumps (e.g., micro C4s) (15), and the silicon space transformer substrate (12) is mounted to the package substrate (13) using a lower density pattern of solder C4 bumps (15). The silicon space transformer substrate (12) comprises a wiring layer (12a) formed on a top-side surface of a thinned silicon substrate (12b) and a plurality of conductive through-vias (12c) formed in the silicon substrate (12b). The thinned silicon substrate (12b) has a thickness of about 150 microns or less, preferably in a range of less than about 70 microns to about 1-10 microns. The wiring layer (12a) comprises a footprint of contact pads corresponding to the micro bumps (14) and redistribution wiring, which provide electrical connections to the conductive through vias (12c).

The wiring layer (12a) and conductive through vias (12c) provide space transforming interconnections between the top-side contacts (14) and bottom-side I/O contacts (15) of the silicon space transformer substrate (12). For example, the chip (11) may be formed having a perimeter array of I/O and power contacts/pads formed on an active surface of the chip (11), whereby the silicon space transformer substrate (12) provides a space transformation from the perimeter array of contacts (14) to an area array of contacts (15). In such case, the silicon space transformer substrate (12) can be the same size (footprint area) of the chip (11) whereby the wiring layer (12a) and conductive through vias (12c) can redistribute the perimeter array contacts (14) to the area array contacts (15).

The package substrate (13) may be an organic substrate, a ceramic substrate, a silicon substrate, etc. that provides a first level package structure, which can be electrically and mechanically mounted to a second level package such as a printed circuit board or printed wiring board, etc. The active surface of the silicon space transformer substrate (12) can include high-density top-die interconnect wiring (12a) and can also serve to support local integrated passive elements and/or active circuit technology depending on the application design.

Figure 2:
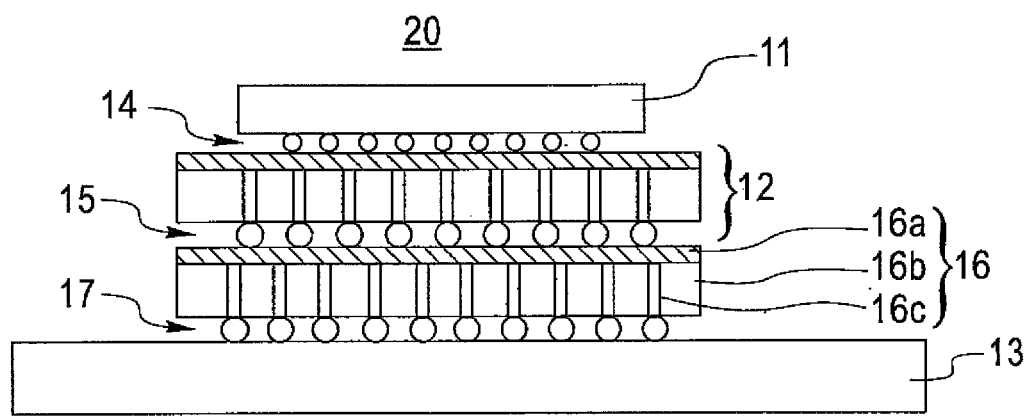
FIG. 2 is a schematic side-view of a semiconductor package that is constructed using a silicon space transformer package structure according to another exemplary embodiment of the invention.

FIG. 2 is a schematic side-view of a semiconductor package (20) that is constructed using a silicon space transformer structure according to another exemplary embodiment of the invention. The semiconductor package (20) is similar to that of FIG. 1 in that the package (20) comprises a stacked structure including the integrated circuit (IC) chip (11), silicon space transformer substrate (12) and a package substrate (13) as depicted in FIG. 1. The exemplary electronic package (20) further includes a second silicon space transformer substrate (16) disposed between the first silicon space transformer substrate (12) and the package substrate (13). The second silicon space transformer substrate (16) may comprise a wiring layer (16a) formed on a top surface of a thinned silicon substrate (16b) and a plurality of conductive through-vias (16c) formed in the silicon substrate (16b), passive circuit components, active circuit components.

FIG. 2 is an exemplary embodiment of a semiconductor package where a silicon space transformer package structure comprises a stacked structure of first and second thinned silicon space transformer substrates (12) and (16). The stacked structure of silicon space transformer substrates (12) and (16) serves various functions. For instance, the additional wiring layer (16a) and conductive through-vias (16c) of the second silicon space transformer substrate (16) may provide additional space transforming interconnections between the bottom-side contacts (15) of the first space transformer substrate (12) and bottom-side I/O contacts (17) of the silicon space transformer substrate (16). Moreover, the addition of the second silicon space transformer substrate (16) provides added strength in that the chip (11) and stacked carriers (12) and (16) can be formed as a stand alone first level package structure (chip module) that can be mounted to the package substrate (13) as part of a second level package structure or system board.

Figure 3:
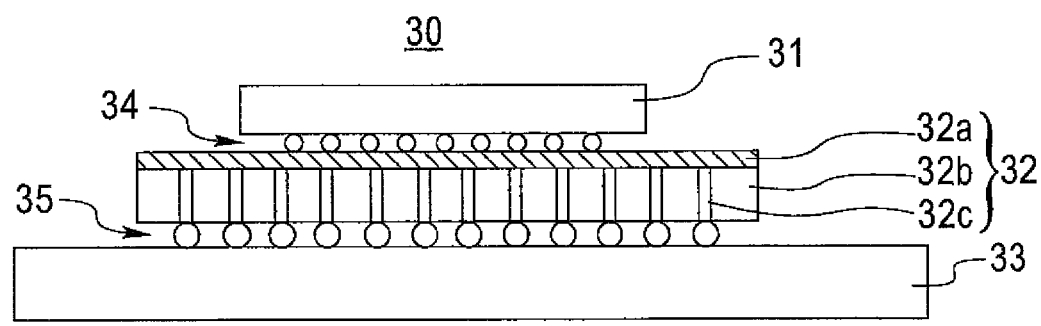
FIG. 3 is a schematic side-view of a semiconductor package that is constructed using a silicon space transformer package structure according to another exemplary embodiment of the invention.

FIG. 3 is a schematic side-view of a semiconductor package (30) that is constructed using a silicon space transformer structure according to another exemplary embodiment of the invention. The semiconductor package (30) is similar to that of FIG. 1 in that the package (30) comprises a stacked structure including the integrated circuit (IC) chip (31), silicon space transformer substrate (32) and a package substrate (33). The IC chip (31) is flip-chip mounted to the space transformer substrate (32) using a pattern of high density micro C4s (35), and the silicon space transformer substrate (32) is electrically and mechanically mounted to the package substrate (33) using a lower density array of C4s (35). The silicon space transformer substrate (32) comprises a wiring layer (32a) formed on a top surface of a thinned silicon substrate (32b) and a plurality of conductive through-vias (32c) formed in the silicon substrate (32b).

The semiconductor package (30) differs from the package (10) of FIG. 1 in that the silicon space transformer substrate (32) has a larger area footprint than the chip (31). In this regard, the chip (11) may be formed having an area array of I/O and power contacts/pads formed on an active surface of the chip (31), whereby the silicon space transformer substrate (32) provides a space transformation from the high-density area array of contacts (34) to a lower density area array of contacts (35). In such case, the footprint of the space transformer substrate (32) can be larger in area than the chip (11) to provide the necessary area to redistribute the area array contacts (34) to larger pitch area array of contacts (35). The package substrate (33) may be an organic substrate, a ceramic substrate, a silicon substrate, etc. that provides a first level package structure, which can be electrically and mechanically mounted to a second level package such as a printed circuit board or printed wiring board, etc.

Figure 4:
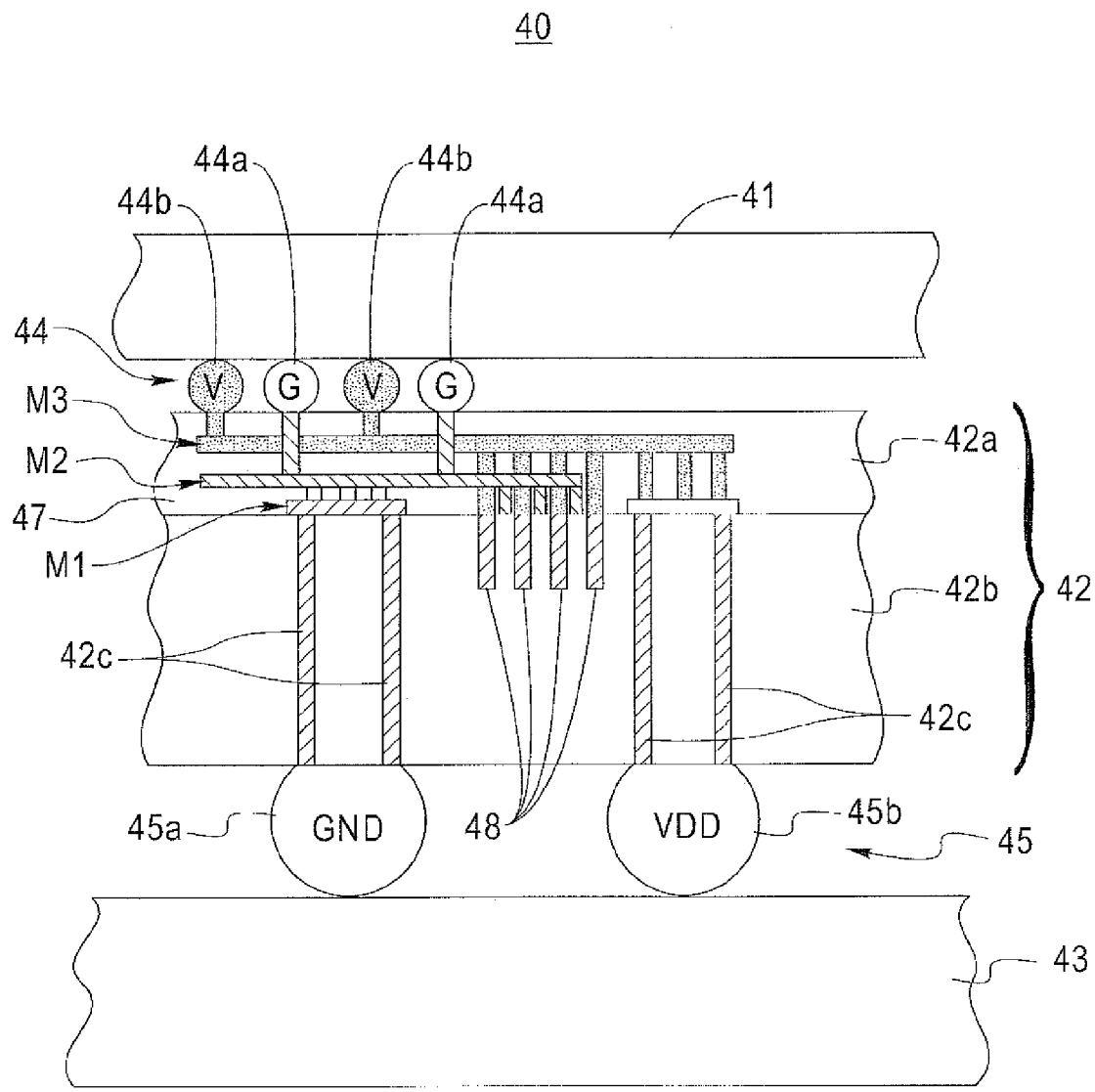
FIG. 4 is a schematic side-view of a semiconductor package that is constructed using a silicon space transformer package structure according to another exemplary embodiment of the invention.

FIG. 4 is a schematic side-view of a semiconductor package (40) that is constructed using a silicon space transformer structure according to another exemplary embodiment of the invention. Similar to the exemplary embodiments of FIGS. 1~3 discussed above, the electronic package (40) generally comprises a stacked structure comprising an integrated circuit (IC) chip (41), a silicon space transformer substrate (42) and a package substrate (43). The IC chip (41) is flip-chip mounted to the space transformer substrate (42) using a high density array of micro C4s (44), and the space transformer (42) is mounted to the package substrate (43) using a lower density array of C4s (45). The silicon space transformer substrate (42) comprises a wiring layer (42a) formed on a topside surface of a thinned silicon substrate (42b) and a plurality of conductive through-vias (42c) formed in the silicon substrate (42b). The thinned silicon substrate (12b) has a thickness of about 150 microns or less, preferably in a range of about 70 microns to about 10 microns.

FIG. 4 illustrates details of an exemplary embodiment of the wiring layer (42a) which comprises a multilayer metallization structure that provides high-density space transforming electrical connections between the micro bumps (44) and the conductive through vias (42c) as well as integration of passive to components within the silicon space transformer substrate (42). More specifically, in FIG. 4, the wiring layer (42a) comprises a plurality of metallization levels M1, M2, M3 that are formed in one or more layers of dielectric/insulating material (47) to provide wiring such as for signal, voltage and ground interconnections. For instance, the metallization layer M1 is formed to provide contact pads that enable electrical connection between the wiring and the conductive through vias (42c). The metallization layer M2 provide ground wiring to provide ground redistribution of lower pitch ground contacts (45a) on the bottom-side of the silicon carrier (42) to tighter pitch ground contacts (44a) on the topside of the silicon space transformer substrate (42). The metallization layer M3 provides voltage wiring to provide power redistribution of lower pitch voltage contacts (45b) on the bottom-side of the silicon space transformer substrate (42) to tighter pitch voltage contacts (44b) on the topside of the silicon space transformer substrate (42). Moreover, the same metallization layers M1 and/or M2 or additional metallization layers may be used to form I/O wiring and or electrical shielding patterns.

Moreover, in the exemplary embodiment of FIG. 4, trench-based decoupling capacitors (48) are integrally formed as part of the silicon substrate (42b) whereby chip ground and voltage connections (44, 45) between the silicon carrier (42) and chip (41) and connected to the trench-based capacitors via interlevel contact plugs between the metallization level wiring and device terminals on the surface of the silicon substrate (42b). In this embodiment, chip itself may contain a vastly greater number of I/O and power/ground connections than may be effectively handled by standard first-level packaging at present. The BEOL wiring and conductive through vias permit efficient area array signal, power and round interconnection through the thinned silicon space transformer packages.

The structures of FIGS. 1-4 are illustrative of semiconductor chip packages according to exemplary embodiments of the invention which may be constructed using silicon carrier fabrication technologies which follow CMOS back-end-of line design rules that enable low-cost fabrication of silicon carriers having high density wiring and through via interconnects which are sufficient to support high-density I/O SOP packaging solutions. Silicon space transform chip package structures may be constructed using one or more thinned silicon space transformer substrate layers that are fabricated starting with a bulk silicon wafer having an initial bulk thickness of between 700 to 800 microns, which is thinned to less than about 150 microns thick and preferably, less than 70 to 1-10 microns.

One significant advantage in using silicon carrier packages for high density packaging of silicon chips, for example, is that the silicon package substrates layers (or carriers) and the thinned chip have the same or similar CTE (coefficient of thermal expansion). In this regard, during thermal cycling, the expansion and contraction between the silicon carrier packages and silicon chips is matched, thereby minimizing the stresses and strains that may be generated in the contacts (e.g., solder balls) between chip and substrate, thereby allowing high-density micro bump interconnections to scale to smaller sizes.

However, silicon space transformer structures that are built with one or more thinned silicon substrate layers having integrally formed metallic wiring, passive/active components, through-silicon-vias, cavities, etc, may not be able to maintain planarity when freestanding due to local bending caused by thermal stresses resulting from CTE mismatches between the various materials and the ultra thin silicon layers. For example, in the exemplary package structure of FIG. 1, CTE mismatches between the materials (dielectric and metal layers) forming the wiring layer (12a) and the silicon material layer (12b) of the space transformer (12) can cause local bending of the package as a result of thermal cycling and temperature excursions during fabrication when, for example, the chip (11) is being mounted on the package (12).

It is to be appreciated that silicon space transformer package structures such as depicted in FIGS. 1-4 with one or more silicon package levels can be designed based on stress balancing techniques to minimizes the overall (global) bending of the overall package structure, minimize local bending along the region of the chip/silicon transformer package structure and/or minimize in-plane expansion between the different package layers, and thus reduce non-planarity of the structures during handling, processing and assembly. It is important to minimize thermal stressed and maintain planarity of the package structures during handling and assembly operations especially for thinned IC, thinned Si package(s) and module assembly with ceramic, organic or alternate base package and cooling hardware, so as to reduce costs, enhance yields and improve mechanical integrity of the components during fabrication and normal usage.

Stress balancing of package structures may be achieved any number of ways depending on the package architecture based on optimizing the thickness, materials, dimensions, thermal properties (e.g., CTE), mechanical properties (modulus), etc, of the wiring layers, the silicone substrate layers, the thinned IC chips, the IC chips, through vias, dielectric layers, and thermal footprints of the IC chips and/or the process conditions, etc, so as to achieve mechanical stress balance between Si package(s) or the Si package(s) and thinned IC or the Si package(s), thinned IC and module (with cooling cap, spreader ceramic or organic package during fabrication, assembly, usages, etc.

For instance, a silicon space transformer structure formed of a single layer of silicon such as depicted in FIG. 1 or FIG. 3, for example, may be designed such that the frontside wiring layers and bottom side passivation layer/metal bond pads (or bottom side wiring layer are formed with certain dielectric and metallic materials such that the effective CTE and modulus (stiffness) of the metal/dielectric stacks/layers on the front and back sides of the silicon substrate are the same or similar, so as to maintain the planarity of the structure. Moreover, silicon space transformer packages with multiple levels of thin silicon substrate layers may be designed to have an effective thickness/stiffness that is matched to an organic substrate to which the silicon space transformer is mounted. With this design, despite possible in-plane expansion due to CTE mismatch between the organic substrate and the silicon substrate layers, this can reduce or eliminate local bending package structured in the footprint region of the stacked silicon space transformer package structure in the footprint region of package structure.

Figure 5A:
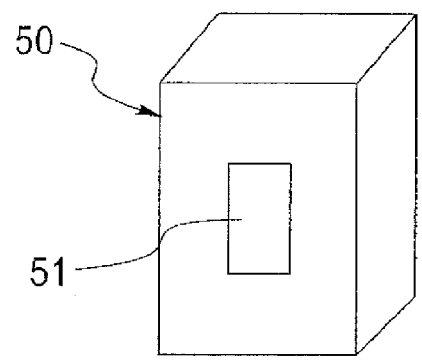
FIGS. 5A, 5B and 5C are schematic high-level illustrations of silicon space transformer package structures having open cavities for optical communications applications, according exemplary embodiments of the invention.
Figure 5B:
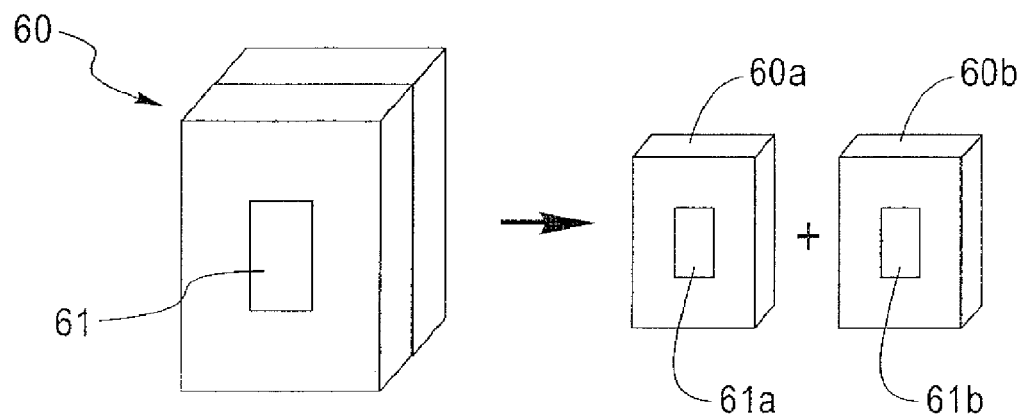
Figure 5C:
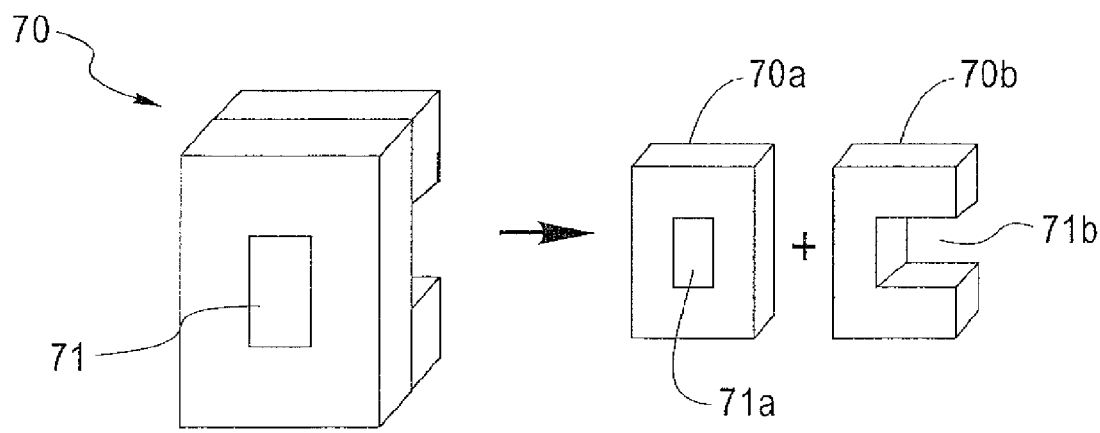

In other exemplary embodiments of the invention, silicon space transformer package structures can be formed having cavities in which separate electrical and optical devices can be disposed for high-density packaging or which provide an optical channel to enable optical communications between optical components disposed on opposing sides of the silicon space transformer structures. FIG. 5A illustrates a single layer silicon space transformer package structure (50) having a cavity (51) etched from topside to bottom side of the silicon substrate. FIG. 5B illustrates a double layer silicon space transformer package structure (60) having a first silicon substrate layer 60a and a second silicon substrate layer 60b having respective cavities 61a and 61b that are aligned to each other when the layers (60a) and (60b) are stacked. FIG. 5C illustrates a double layer silicon space transformer package structure (70) having a first silicon substrate layer 70a and a second silicon substrate layer 70b having respective cavities 71a and 71b that are shaped differently, but aligned to each other when the layers (70a) and (70b) are stacked. The cavities in the exemplary embodiments of FIGS. 5A~5C provide channels that permit light to pass for means of optical communications such as when using photo detectors to receive light or VCSEL chips to send light to corresponding optical waveguides, fibers or links along with other electronic circuit chips that may be mounted on the silicon space transformer package structure or a second level package substrate on which the transformer package structure is mounted.

Figure 6E:
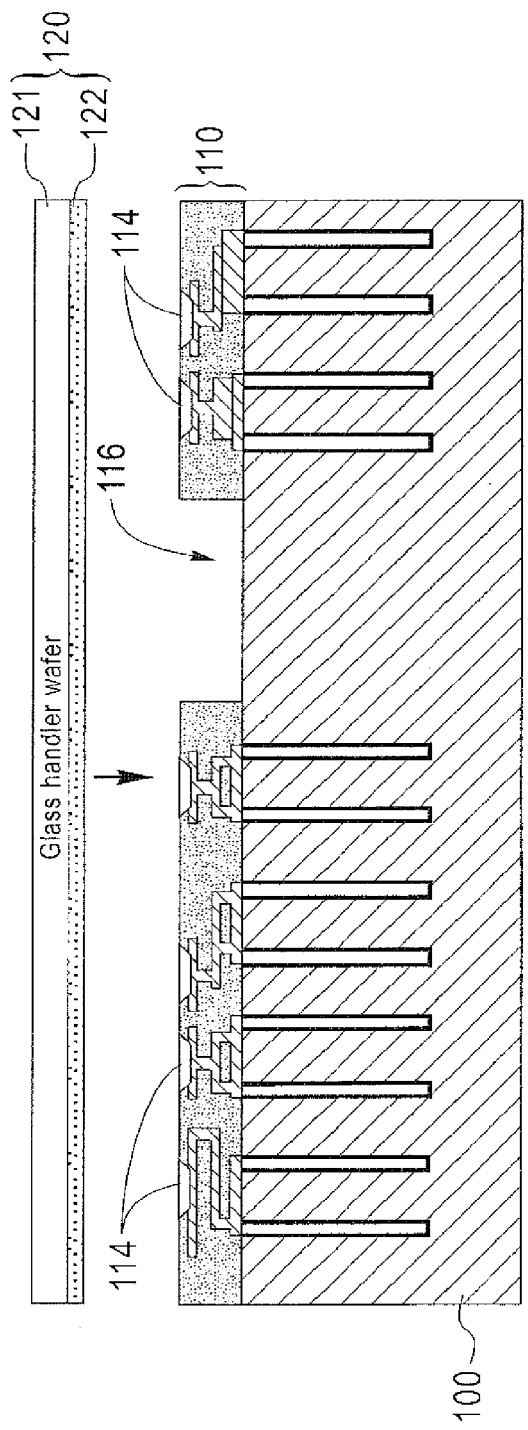

Various methods for fabricating silicon space transformer carriers will now be discussed in further detail below. For example, FIGS. 6A~6J are schematic diagrams that illustrate a method for fabricating a silicon space transformer package structure according to an exemplary embodiment of the invention. In particular, FIGS. 6A~6J illustrate a method for constructing a silicon space transformer package structure comprising a plurality of silicon sub-package layers in which a glass handler is implemented for building and subsequent release/removal. FIG. 6A illustrates initial steps in the exemplary process where a semiconductor silicon wafer (100) of thickness t is etched to form a plurality of annular trenches (101) to a depth d below a front side surface of the wafer (100). Each annular trench (101) surrounds (encircles) an inner core (or post) (102) of substrate material. The annular vias (101) are etched in a pattern over the wafer (100) except for a given area (101a) in which cavities will be subsequently formed for embedding of separate electronic devices (e.g., optoelectronic devices). The annular trenches (101) can be formed using conventional methods including forming an etch mask on the surface of the wafer (100) and etching the wafer (100) using any suitable anisotropic etching process such as RIE (reactive ion etching).

Referring to FIG. 6B, following the etching of the annular trenches (101), a barrier/adhesion layer (103) (or liner layer) is formed to line the exposed insulated sidewall and bottom surfaces of the annular trenches (101). The liner layer (103) may be deposited in one layer or stacked layers. For instance, a first layer of silicon oxide or silicon nitride may be deposited to provide a barrier layer. For example, the liner (103) may include an oxide that is grown or deposited using known techniques, such as, thermal oxidation, CVD (chemical vapor deposition), or a nitride that is formed by CVD, etc. In another embodiment. The liner layer (103) may include added filler material such as poly-Si other material so that the liner layer (102) provides sufficient insulation characteristics while forming a controlled stress insulator layer having a CTE that is more closely matched to that of the silicon material of the substrate (100). The liner layer (103) may further include an adhesion layer (or seed layer) formed on the barrier layer to that forms good adhesion to both the barrier layer metal and to a via conductor metal (e.g., tungsten) that is used to fill or plate the annular trenches (101). In particular, the liner layer (103) may have a seed layer formed by depositing one or more conformal layers of TaN, Ta, Ru, Ti, and/or TiN using PVD, CVD, ALD, etc. A single layer of TiN functions as both a barrier metal and adhesion layer. If a barrier metal other than TiN is utilized, an adhesion layer may be deposited including adhesion metals such as chromium, titanium or titanium tungsten, using known techniques.

After formation of the liner layer (103), a metallization process is performed to overfill the via annular trenches (101) with a desired conductive material (104) followed by a planarization process to remove excess metal at the top surface of the substrate (100). The metallization and planarization process results in formation of a plurality of electrically isolated, close-ended conductive annular vias (105) as depicted in FIG. 6C, wherein each conductive annular via (105) comprises an annular ring of conductive material (104) and liner layer (103) surrounding an inner core (102) of silicon. The annular trenches (101) may be filled by depositing a conformal layer of metallic material such as tungsten (W) and/or other conductive materials preferably having a CTE comparable to that of silicon. The metal deposition may be performed using suitable methods such as CVD or PVD, for example, depending on the conductive material used and the diameter and depth of the annular via trenches (101). Thereafter, planarization may be performed using a CMP (chemical mechanical polishing) process to planarize the surface of the substrate (100) and remove the excess layer of metal material (104) and metal seed layer of the liner (103) down to the insulating (barrier) layer of the liner (103) on the surface of the substrate (100).

Next, referring to FIG. 6D, a BEOL (back end of line) process is performed using conventional methods to form a metal wiring layer (110) comprising one or more levels of metallization (111~113) embedded in insulating material (115) on the upper surface of the wafer (100) over the vias (105). The wiring layer (110) may include a first metal layer that forms contact pads (111) for each via (105), and metal layers to form wiring levels (112) and (113) which are interconnected by interlevel contact plugs. The insulating layer (115) would be formed a stack of ILD (interlayer dielectric) layers that are deposited for each metal layer. Portions of the third wiring layer (113) are exposed through openings in the upper layer of insulating material (115) to provide terminal pads that are coated with a solder-wettable layer (114) such as Ni/Au. The wiring layer (110) may be constructed using standard CMOS BEOL fabrication processes. For example, the metal layers (111), (112) and (113) and interlevel contact plugs may be formed of copper using single or dual damascene processing techniques.

Referring still to FIG. 6D, following formation of the wiring layer (110), an etch process is performed to form an opening in the insulating layer (115) down to the surface of the silicon substrate (100) in the surface region (101a). The opening (116) in the insulating layer (115) defines the footprint of a cavity to be subsequently etched in the silicon substrate (100), in later processing as discussed below.

Next, referring to FIG. 6E, a handler substrate (120) having a glass substrate (121) coated with a layer of bonding/adhesive material (122) is bonded to the substrate (100) with the completed BEOL wiring (110). After the handler substrate (120) is laminated to the substrate (100), the backside of the silicon wafer (100) is subjected to a grinding and polishing process to expose the bottom ends of the annular vias (105) using known techniques. This process may be performed using conventional grinding, polishing and/or chemical etch processes. For instance, a backside grind and polish can be performed on the back surface of the wafer (100) to remove the silicon material within 10-20 microns of bottom of the vias (105). A wet etch can then be performed to expose the bottom portions of the liner (103) and recess the silicon material slightly past the bottoms of the vias (105). A blanket layer of oxide (125), or other insulating material is deposited and polished (via CMP) to expose the bottoms of the vias (150), such that the back surface of the silicon wafer (100) is thus completely insulated by the insulating layer (125) and but with the bottoms of the vias (105) exposed. Thereafter, metal pads (130) (e.g., Cr/Cu BLM) can be formed over the exposed bottom surfaces of the vias (105) using known techniques, resulting in the silicon carrier structure depicted in FIG. 6F. The insulation layer (125) insulates the contacts (130) from the silicon substrate (100).

Referring to FIG. 6G, a backside lithographic etch process is performed using known techniques to each a cavity (140) in the backside of the silicon substrate (100) that is aligned to the opening (116) in the insulating layer (115) of the layer (110) in region (101a) of the substrate. FIG. 6G illustrates an intermediate stage of fabrication in which a first sub-package layer of a silicon space transformer package structure is formed and mechanically coupled to a glass handler (120). FIGS. 6F~6J schematically illustrate subsequent processing steps in which a second sub-package layer is formed and mechanically/electrically mounted to the first sub-package layer to form the complete silicone space transformer package structure.

FIG. 6H schematically illustrates a second sub-package layer that is formed starting with a silicon substrate (200) of thickness t2. A plurality of blind annular vias (205) are formed to a depth d2 below a top surface of the substrate (200) having a pattern similar to the pattern of the annular vias (105) of the first sub-package layer. A cavity (240) is etched in the substrate (200) to a depth below the bottoms of the annular vias (205). An insulating layer (225) and metal pads (230) are formed on the top surface of the substrate (200) where the metal pads (230) are formed on the open ends of the annular vias (205). The second sub-package layer can be fabricated using the same or similar methods discussed with reference to FIGS. 6A~6C and 6G.

Figure 6F:
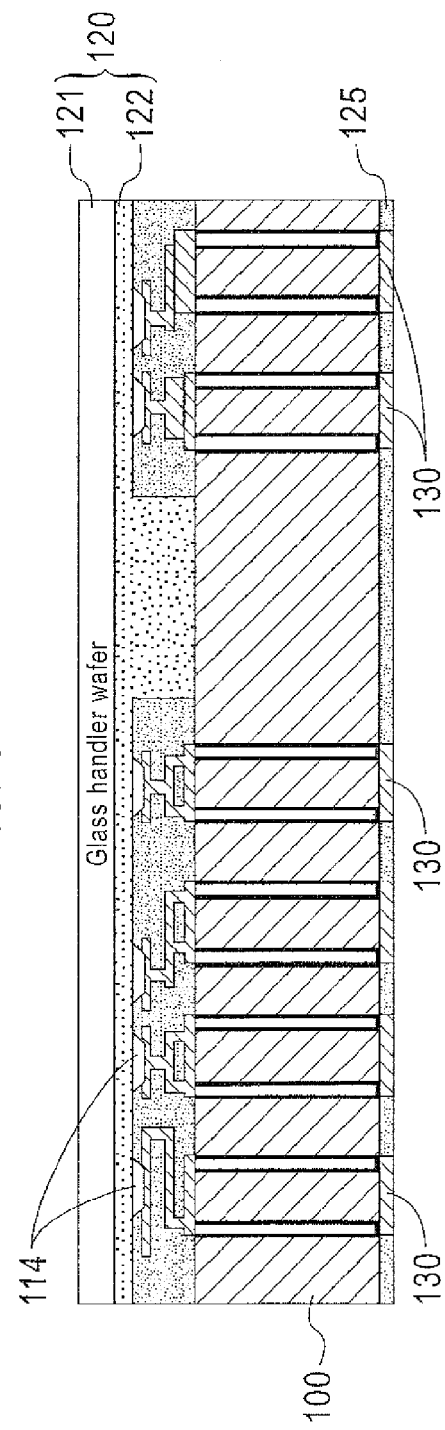
Figure 6I:
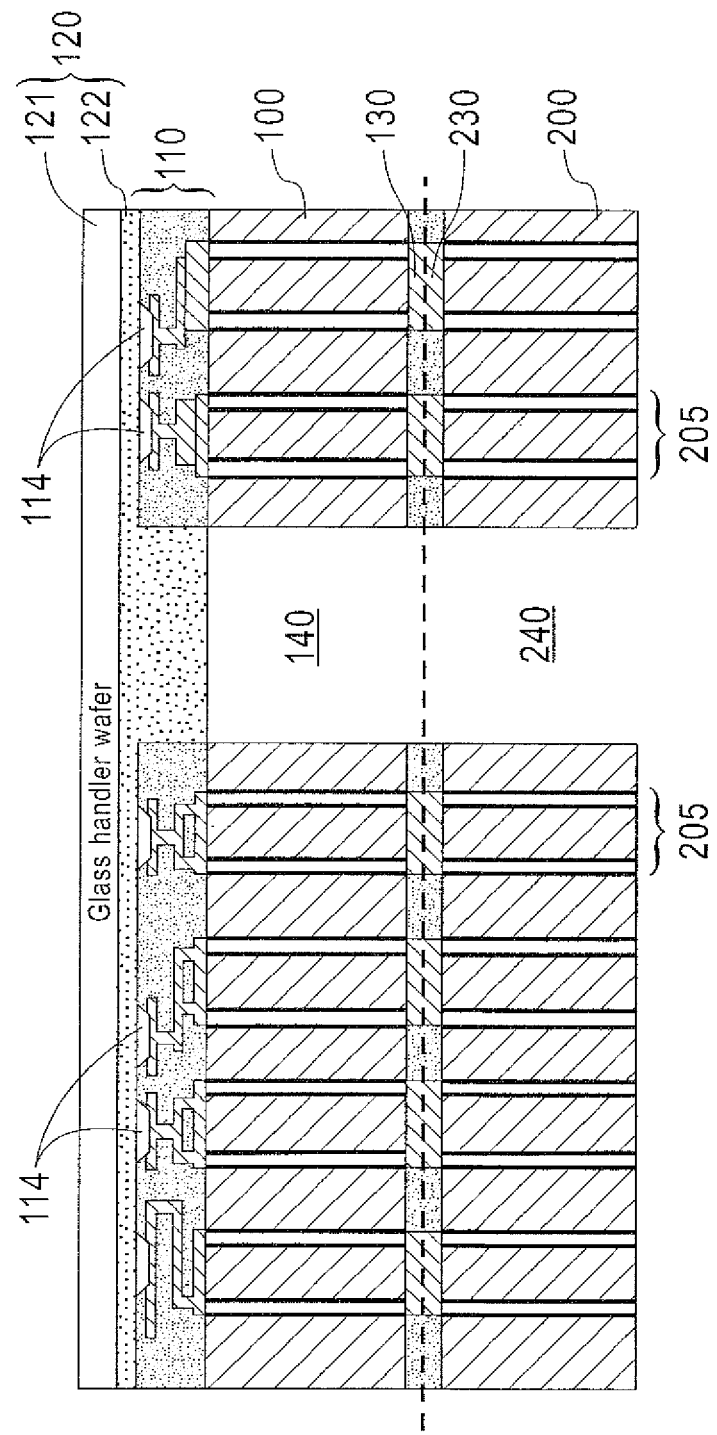
Figure 6J:
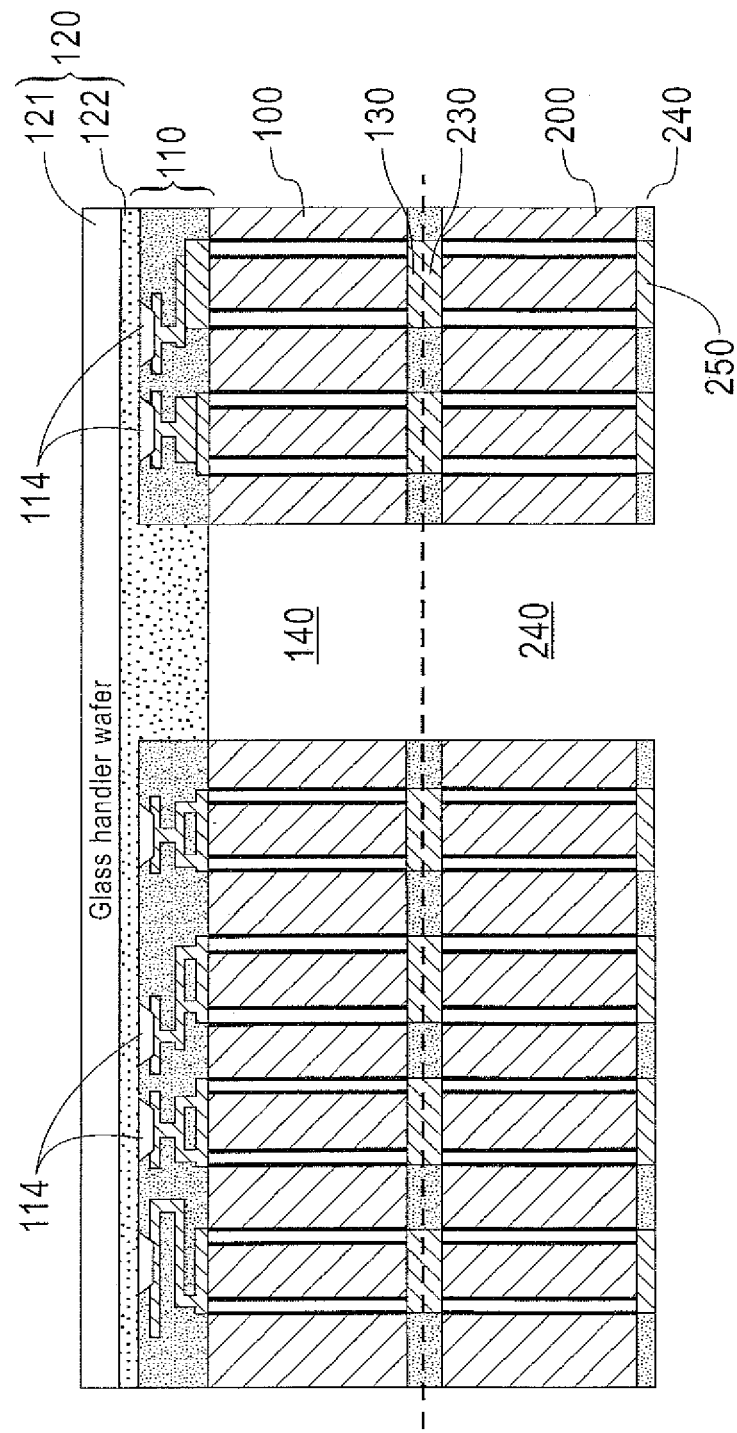

Referring to FIG. 6I, the backside of the first substrate and frontside of the second substrate (200) may be bonded together via copper bonding the corresponding metallic pads (130) and (230) on the respective surfaces. Thereafter, using the same or similar techniques as described with reference to FIG. 6F, the second substrate (200) is subjected to a backside grind process to expose the bottom, closed-end of the conductive annular vias (205) and open the cavity (240), followed by formation of an insulating layer (240) and metal pads (250) (e.g., BLM or NiAu bond pads) on the backside surface of the second substrate (200). Thereafter, the mechanical glass carrier (120) can be removed by laser release of adhesive with appropriate cleaning or thermal release or IR release depending on the use of such mechanical handler.

Figure 7A:
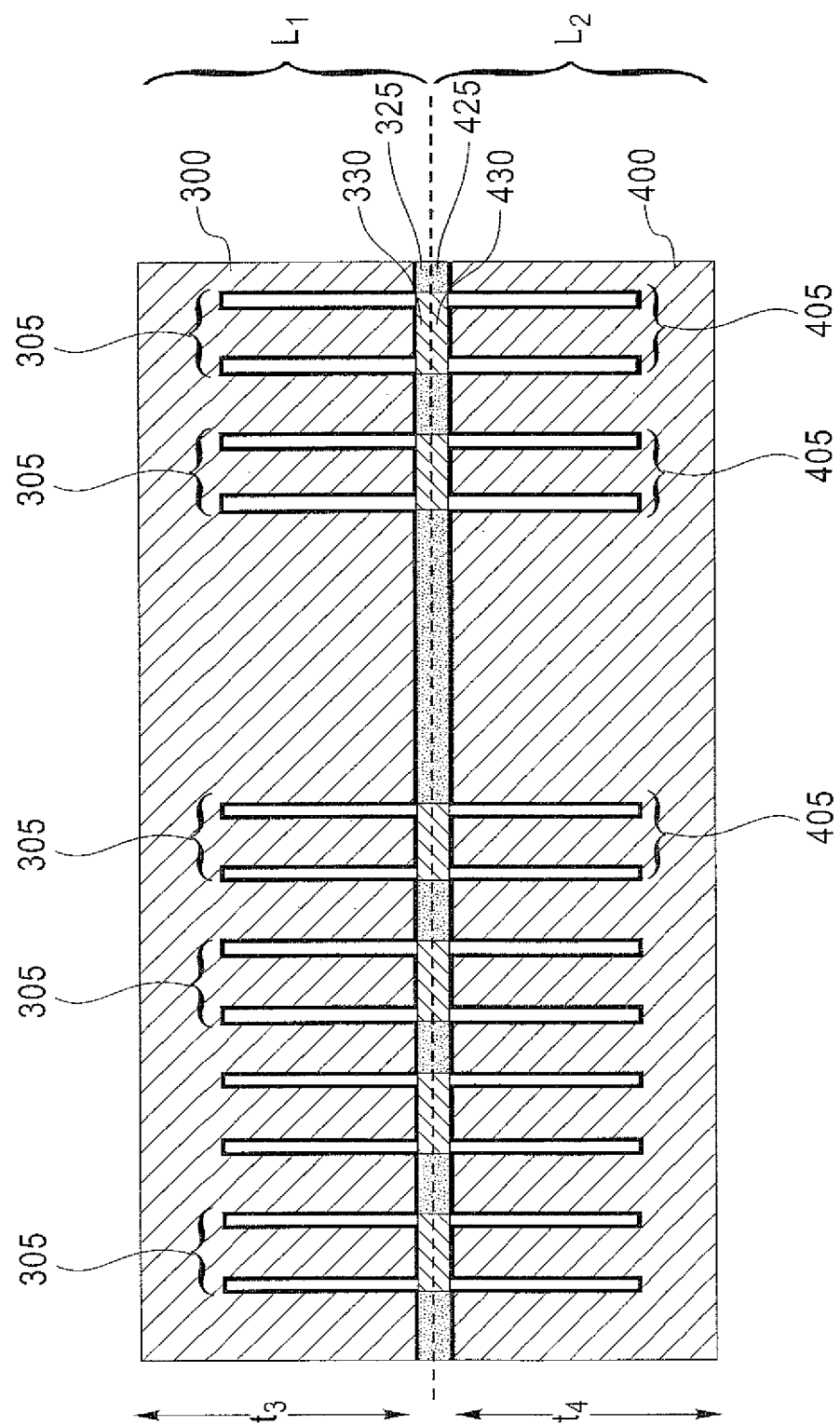
FIGS. 7A~7E schematically illustrate a method for fabricating a silicon space transformer package structure according to an exemplary embodiment of the invention.

FIGS. 7A~7E are schematic diagrams that illustrate a method for fabricating a silicon space transformer package structure according to another exemplary embodiment of the invention. In particular, FIGS. 7A~7E illustrate a method for constructing a silicon space transformer package structure comprising a plurality of silicon sub-package layers in which a silicon wafer is used as a mechanical handlers for building the silicon space transformer package structure. FIG. 7A schematically illustrates an intermediate stage of fabrication where a first sub-package layer L1 and second sub-package layer L2 are bonded frontside face-to-frontside face. The first sub package layer L1 is formed starting with a silicon substrate (300) of thickness t3. A plurality of blind annular vias (305) are formed to a depth d2 below a top surface of the substrate (300) An insulating layer (325) and metal pads (330) are formed on the top surface of the substrate (300) where the metal pads (330) are formed on the open ends of the annular vias (305). The second sub package layer L2 is formed starting with a silicon substrate (400) of thickness t4. A plurality of blind annular vias (405) are formed to a depth d2 below a top surface of the substrate (400) An insulating layer (425) and metal pads (430) are formed on the top surface of the substrate (400) where the metal pads (430) are formed on the open ends of the annular vias (405). In the exemplary embodiment, the annular vias (305) and (405) in the first and second sub-package layers L1 and L2 are formed to have the same layout and pattern, although other patterns may be implemented based on the application. The first and second sub-package layers L1 and L2 can be fabricated using the same or similar methods discussed with reference to FIGS. 6A~6C and 6G. The frontside of the first substrate (300) and frontside of the second substrate (400) may be bonded together via copper bonding the corresponding metallic pads (330) and (430) on the respective surfaces, resulting in the structure of FIG. 7A.

Figure 7B:
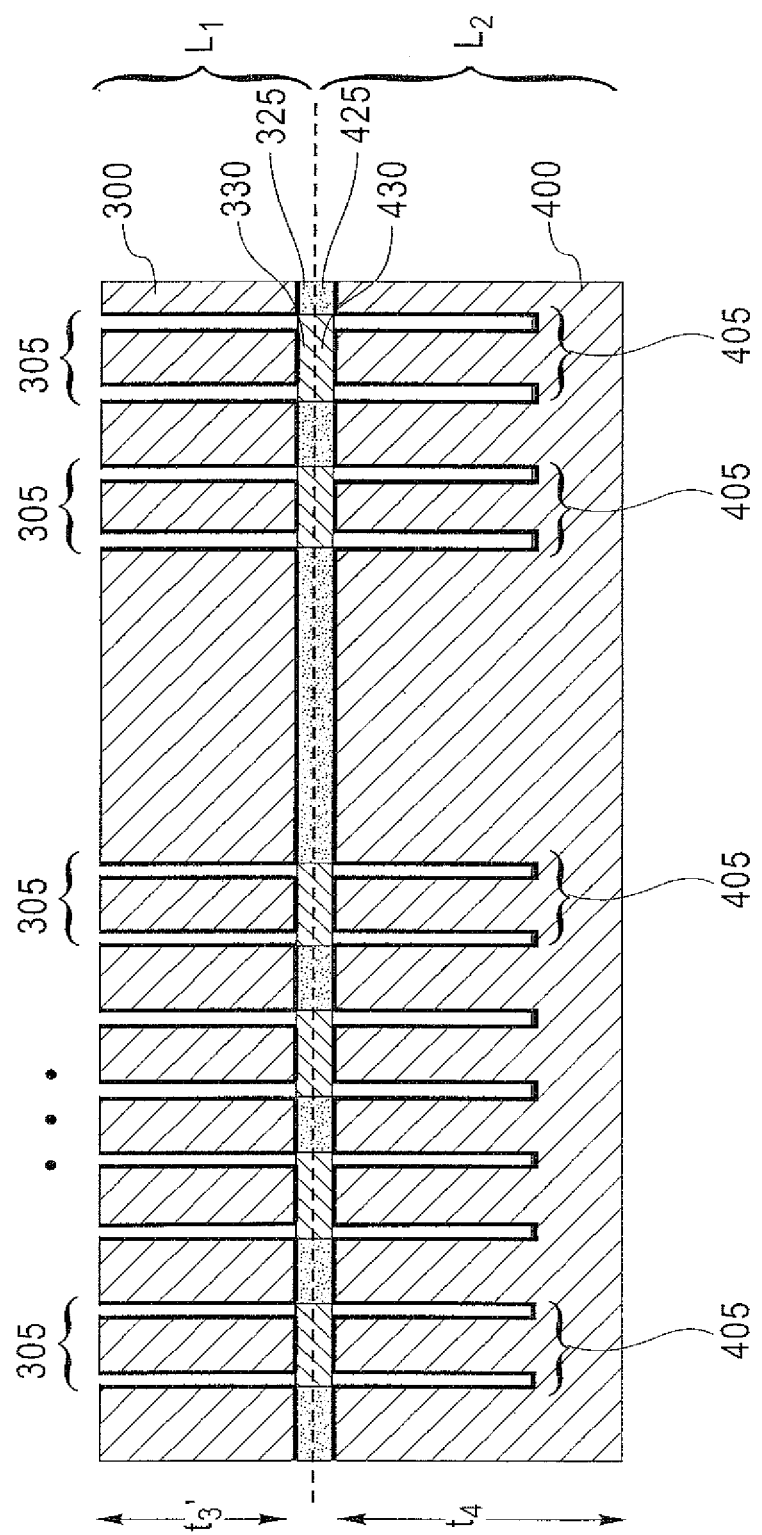
Figure 7C:
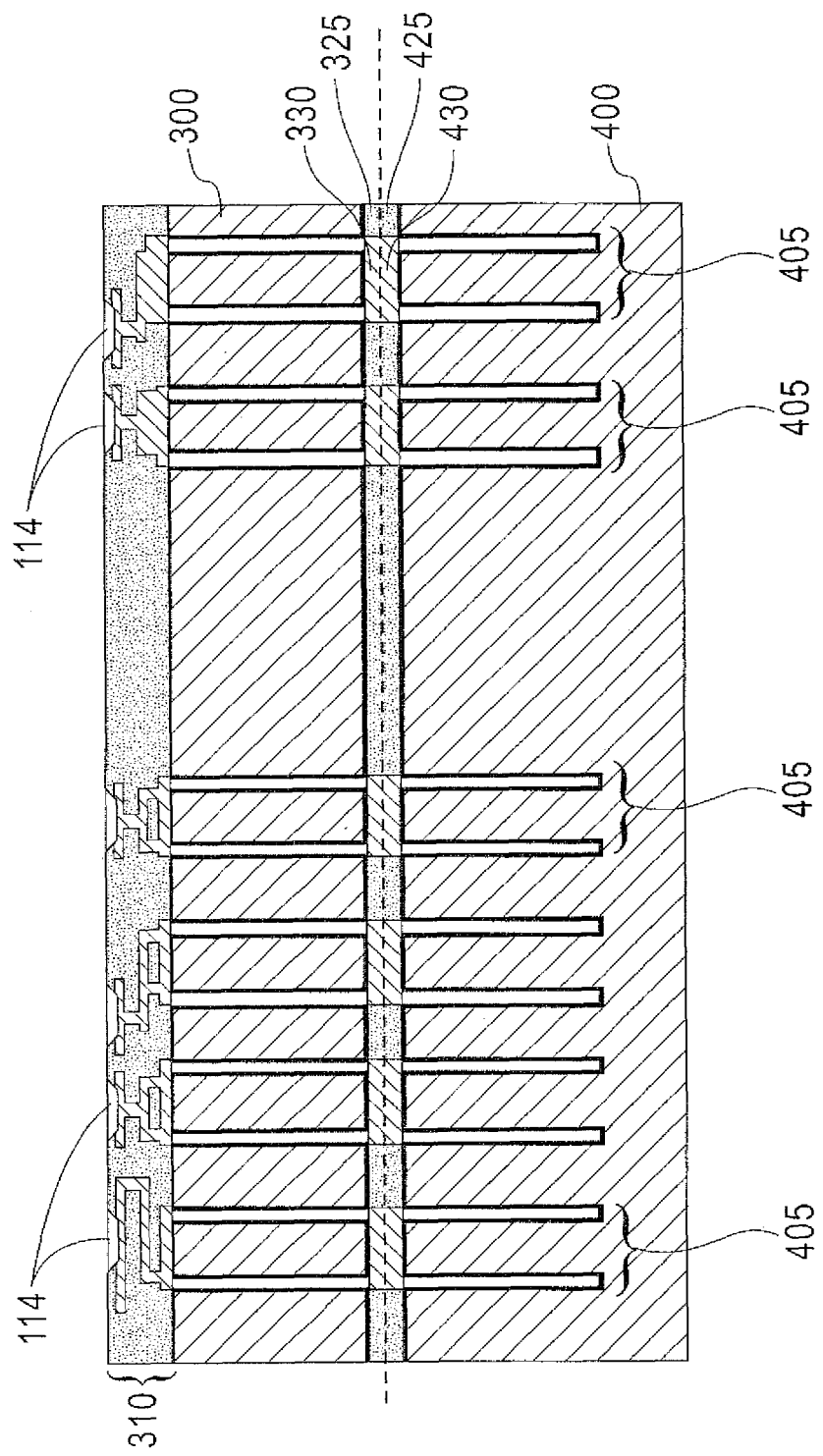
Figure 7D:
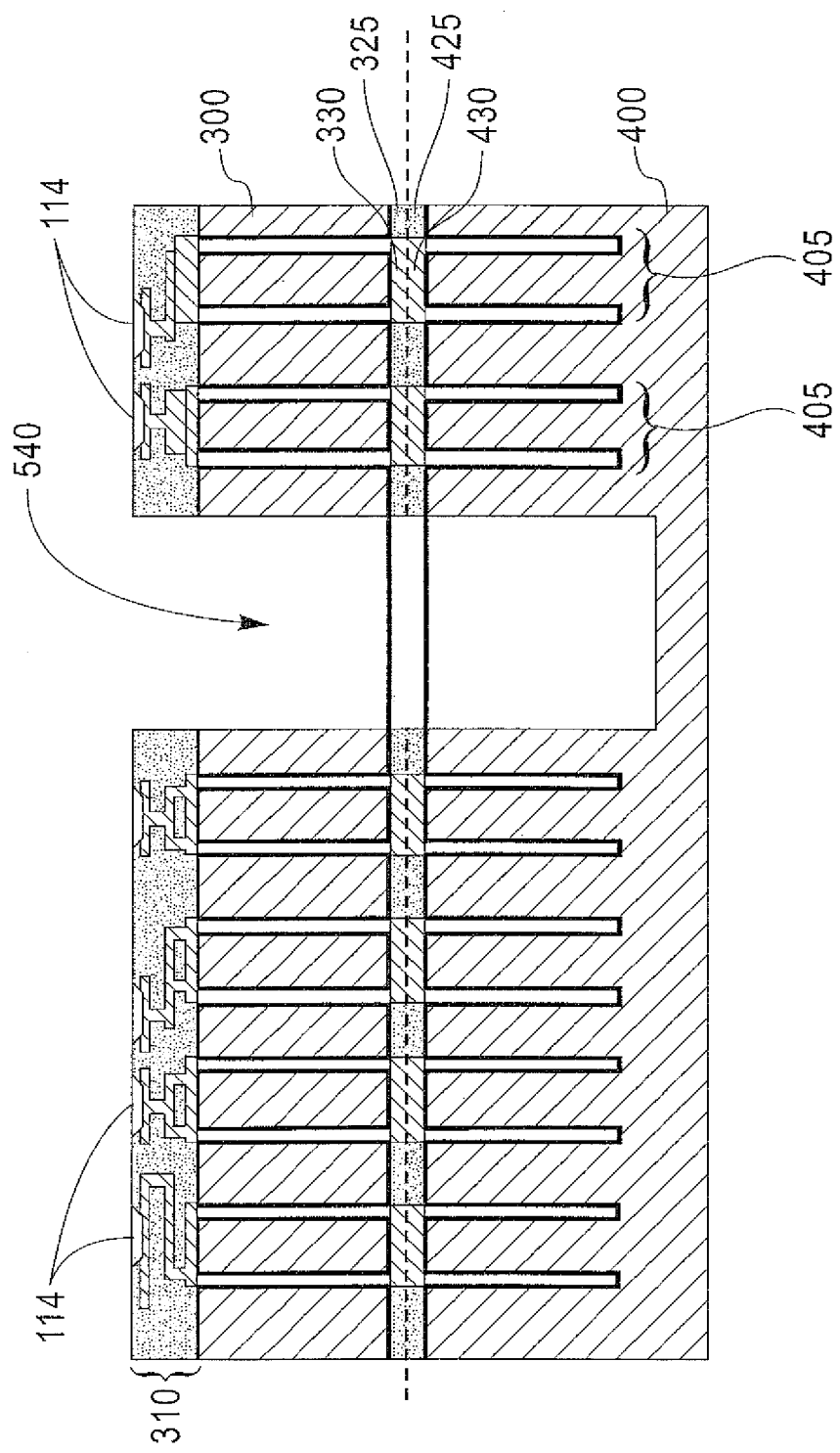
Figure 7E:
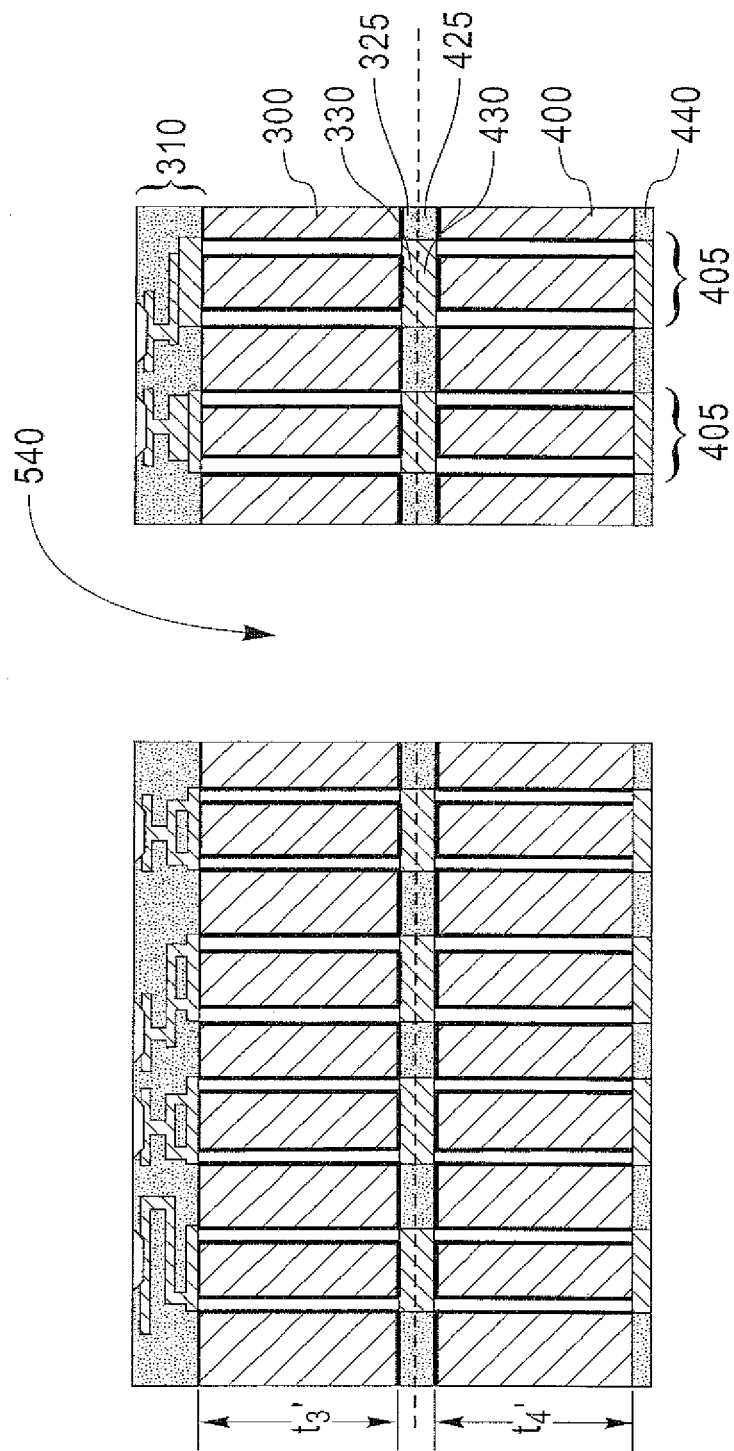

Thereafter, using the same or similar techniques as described with reference to FIG. 1F, the first substrate (300) is subjected to a backside grind process to expose the bottom, closed-end of the conductive annular vias (305), resulting in the structure schematically illustrated in FIG. 7B. IN this process, the thickness of the substrate (300) is reduced from t3 to t3'. Next, as depicted in FIG. 7C, a BEOL process is performed using conventional methods to form a metal wiring layer (310) over the backside surface of the substrate (300) to form one or more levels of wiring as desired. Referring to FIG. 7D, a photolithographic etch process is then performed to form a cavity (540) from the backside surface of the substrate (300) through the two substrate layers (300) and (400) to a depth just below the depth of the annular vias (405) below the frontside surface of the substrate (400).

Thereafter, using the same or similar techniques as described with reference to FIG. 6F, the second substrate (400) is subjected to a backside grind process to expose the bottom, closed-end of the conductive annular vias (405) and open the cavity (540), followed by formation of an insulating layer (440) and metal pads (450) (e.g., BLM or NiAu bond pads) on the backside surface of the second substrate (400).

The methods described above are illustrative of exemplary embodiments of the invention for constructing semiconductor chip packages using silicon carrier fabrication technologies which follow CMOS back-end-of line design rules to enable low-cost fabrication of silicon carriers having high density wiring and through via interconnects which are sufficient to support high-density I/O SOP packaging solutions. Silicon space transform chip package structures may be constructed using one or more thinned silicon space transformer substrate layers having through-silicon-vias which permit electrical connections to extend through the one or more silicon substrate layers and high density wiring layers in electrical contact with the conductive through vias to provide space transformation high I/O density packaging of one or more thinned IC chips. Each layer of silicon may be fabricated from a bulk silicon wafer having an initial bulk thickness of between 700 to 800 microns, which is thinned to less than about 150 microns thick and preferably, less than 70 to 1-10 microns thickness and designed and fabricated using stress balanced structures such that the non-planarity due to wiring, vias, circuits and assembly are reduced or minimized to aide in handling and assembly.

The space transformation may be realized using a multilevel wiring layer that includes signal, power and/or ground wiring. The space transformation may be from an area array pitch to another area array pitch of same or different pitch, may be from perimeter array to area array or custom I/O footprint to another I/O footprint, and may be fan in, fan out or a combination. In other embodiments described above, passive functionality may be integrated within one or more silicon layers including, for example, decoupling capacitors, inductors, and/or resistors which can help to reduce or eliminate the need for integrated passive function on the chip and/discrete or integrated passives on the package and board.

The use of the multilevel BEOL wiring levels formed on one side or both sides and/or more than one thinned silicon sub package layers not only provides increased wiring such as for signal, voltage and ground interconnections, but also provide a mechanical benefited of added thickness for enhanced mechanical handling and reduced non-planarity during processing, manufacturing and/or assembly, which helps to provide planarity to the silicon space transformer structure such as by means of stress balancing, which prevents bending in instances where the thinned silicon substrate layers with wiring, passive components, through-silicon-vias, cavities and/or active tend to not maintain planarity when freestanding without the application of external forces or added balancing Si sub-package layers. The silicon package structure can provide matched coefficient of thermal expansion between silicon chips and package substrates such as ceramic or organic laminates to reduce stress for low K dielectric chips and/or air gap chips as well as to reduce stress to conventional ceramic or organic packages.

The silicon space transformer package structures can be designed with silicon sub-package layers that are modular in build and function. For example, one silicon substrate level may be designed to provide standard space transformation wiring whereas another silicon substrate layer may provide integrated decoupling while yet another silicon substrate layer may be designed to provide power and ground wiring, such that when integrated, each separate silicon package layer can be manufactured in a low cost wafer manor and integrated using or reusing a sub-package for low cost and high volume production.

Another exemplary embodiment of the invention as applied to one application is to provide very high interconnection density to cache or memory chips and to processor, graphics or game chips so as to provide 10× to 10,000× increase data rates compared to traditional cache chips and other memory chips such as DRAM or SRAM. In this way the performance of the application may be increased, the power per I/O significantly reduced and the functionality of the device may be scaled significantly compared to current integration between processor and memory type chips. The benefit from silicon packaging, chip stacking and increased I/O density on and off both the memory chips and processor type chips with reduced latency, reduced wire lengths, reduced power, and option to reduce the mux/demux for chip simplification and latency reduction are also key enablers possible with this invention. The change specifically from I/O density of <100 I/O per $mm^2$ to I/O density of >500 I/O or >1000 I/O per $mm^2$ for memory chips, processor chips, graphics chips, game chips and other IC's. Another benefit for this invention leverages this high H/O interconnection density for memory chips and chip stacks connected to processor, graphics and game chips with one or more multiprocessors cores and threads is included in this invention. The design for memory chips to benefit from this design enhancement are also called out with high I/O density for connection in a chip stack or on silicon package with high I/O interconnection and wiring using one or more levels of Si interposer to processor like chips is also included in this invention for performance enhancement and relative power reductions.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

What is claimed is:

1. An electronic apparatus, comprising:
   a first level package structure comprising a silicon space transformer chip carrier structure and an integrated circuit chip flip chip mounted on a first surface of the silicon space transformer chip carrier structure using a first pattern of electrical contacts with pitch P1; and
   a second level package substrate comprising a second pattern of electrical contacts with pitch P2, wherein P2>P1, formed on a mounting surface thereof,
   wherein the first level package structure is mounted to the mounting surface of the second level package substrate with the silicon space transformer chip carrier structure providing space transforming electrical interconnections between the first pattern of electrical contacts and the second pattern of electrical contacts on the mounting surface of the second level package structure, and
   wherein the silicon space transformer chip carrier structure comprises:
      a planar silicon substrate having a first planar surface and a second planar surface opposing the first planar surface;
      a plurality of annular conductive through-vias formed in the planar silicon substrate to surround an inner core of silicon substrate material and to provide vertical electrical connections extending through the planar silicon substrate between the first planar surface and the second planar surface.

2. The electronic apparatus of claim 1, wherein the silicon space transformer chip carrier structure further comprises
   a wiring layer formed on the first planar surface of the silicon substrate, the first wiring layer comprising the first pattern of electrical contacts and redistribution wiring,
   wherein the planar silicon substrate has a thickness of less than about 150 microns between the first planar surface and the second planar surface, and wherein the redistribution wiring and the annular conductive through-vias provide space transform electrical connections between the first pattern and second pattern of electrical contacts.

3. The electronic apparatus of claim 1,
wherein the first pattern of electrical contacts is an area array of contacts having the pitch P1, and
wherein the second pattern of electrical contacts is an area array of contacts having the pitch P2.

4. The electronic apparatus of claim 1,
wherein the first pattern of electrical contacts is a perimeter array of contacts having the pitch P1, and
wherein the second pattern of electrical contacts is an area array of contacts having the pitch P2.

5. The electronic apparatus of claim 1, further comprising a plurality of passive devices formed on the first planar surface of the first silicon substrate and electrically connected to the wiring layer.

6. The electronic apparatus of claim 1, wherein the wiring layer is a multilayer structure comprising three or more metallization levels.

7. The electronic apparatus of claim 6, wherein the wiring layer comprises power and ground wiring levels.

8. The electronic apparatus of claim 1, wherein the planar silicon substrate comprises an open cavity formed therein between the first surface thereof and the mounting surface of the second level package substrate and an electronic device disposed in the open cavity and mounted on the second level package substrate.

9. The electronic apparatus of claim 1, wherein the silicon space transformer carrier structure comprises a stack of two or more planar silicon substrates each having a thickness of less than about 150 microns to about 1-10 um.

10. The electronic apparatus of claim 1, wherein the first pattern of electrical contacts of the silicon space transformer carrier structure provides an array of pads for interconnection to one or more integrated circuit (IC) chips with I/O interconnection densities greater than about 500 I/O per $mm^2$.

11. The electronic apparatus of claim 10, wherein the I/O interconnection densities are greater than about 1000 I/O per $mm^2$.

12. The electronic apparatus of claim 10, wherein the one or more IC chips include a memory chip, a chip stack, a processor chip, a graphics chip, a game chip, an image sensing chip or a combination of such chips, which are separately mounted on the silicon space transformer carrier structure or mounted in a stacked configuration on the silicon space transformer carrier structure.

13. The electronic apparatus of claim 9, wherein each of the two or more planar silicon substrates have annular conductive through-vias formed therein to surround inner cores of silicon substrate material and to provide vertical electrical connections extending between top and bottom sides of the stack of planar silicon substrates.

* * * * *